US009038263B2

(12) United States Patent
Puccio et al.

(10) Patent No.: US 9,038,263 B2
(45) Date of Patent: May 26, 2015

(54) THICKNESS SHEAR MODE RESONATOR SENSORS AND METHODS OF FORMING A PLURALITY OF RESONATOR SENSORS

(75) Inventors: Derek Wayne Puccio, Murray, UT (US); Errol P. EerNisse, Salt Lake City, UT (US)

(73) Assignee: Delaware Capital Formation, Inc., Wilmington, DE (US)

( * ) Notice: Subject to any disclaimer, the term of this patent is extended or adjusted under 35 U.S.C. 154(b) by 505 days.

(21) Appl. No.: 13/350,577

(22) Filed: Jan. 13, 2012

(65) Prior Publication Data
US 2012/0181900 A1 Jul. 19, 2012

Related U.S. Application Data

(60) Provisional application No. 61/432,433, filed on Jan. 13, 2011.

(51) Int. Cl.
*H04R 31/00* (2006.01)
*G01L 9/00* (2006.01)

(52) U.S. Cl.
CPC ............... *G01L 9/0022* (2013.01); *Y10T 29/42* (2015.01); *G01L 9/0016* (2013.01)

(58) Field of Classification Search
CPC ........... H03H 3/00; H03H 3/007; H03H 3/02; H03H 3/06; H03H 3/08; H03H 9/02007; H03H 9/02015; H03H 9/02055; H03H 9/0222; H03H 9/02228; H03H 9/02275; H03H 9/02296; H03H 9/02535; H03H 9/0504; H03H 9/059; H01L 41/277; H01L 41/31; H01L 41/47

USPC .............. 29/25.35, 594, 595, 609.1; 310/319, 310/338, 370; 331/158, 176
See application file for complete search history.

(56) References Cited

U.S. PATENT DOCUMENTS

| 3,561,832 A | 2/1971 | Karrer |
| 3,617,780 A | 11/1971 | Benjaminson |
| 3,645,137 A | 2/1972 | Hazen |
| 3,981,480 A | 9/1976 | EerNisse |
| 4,078,226 A | 3/1978 | EerNisse et al. |

(Continued)

FOREIGN PATENT DOCUMENTS

| EP | 0050307 | 4/1982 |
| EP | 0136627 | 4/1985 |

(Continued)

OTHER PUBLICATIONS

O. Vallin, et al., "Direct Bonded Quartz Resonators", Frequency Control Symposium and PDA Exhibition, 2001, Proceedings of the IEEE International. pp. 345-348, 608 Jun. 2001.

*Primary Examiner* — Paul D Kim
(74) *Attorney, Agent, or Firm* — TraskBritt

(57) ABSTRACT

Arrays of resonator sensors include an active wafer array comprising a plurality of active wafers, a first end cap array coupled to a first side of the active wafer array, and a second end cap array coupled to a second side of the active wafer array. Thickness shear mode resonator sensors may include an active wafer coupled to a first end cap and a second end cap. Methods of forming a plurality of resonator sensors include forming a plurality of active wafer locations and separating the active wafer locations to form a plurality of discrete resonator sensors. Thickness shear mode resonator sensors may be produced by such methods.

14 Claims, 6 Drawing Sheets

(56) References Cited

U.S. PATENT DOCUMENTS

| | | |
|---|---|---|
| 4,215,570 A | 8/1980 | EerNisse |
| 4,372,173 A | 2/1983 | EerNisse et al. |
| 4,419,600 A | 12/1983 | Sinha |
| 4,455,874 A | 6/1984 | Paros |
| 4,479,391 A | 10/1984 | Banik et al. |
| 4,526,247 A | 7/1985 | EerNisse et al. |
| 4,531,073 A | 7/1985 | EerNisse |
| 4,535,638 A | 8/1985 | EerNisse et al. |
| 4,547,691 A | 10/1985 | Valdois et al. |
| 4,550,610 A | 11/1985 | EerNisse |
| 4,554,717 A | 11/1985 | Vig et al. |
| 4,562,375 A | 12/1985 | Besson et al. |
| 4,592,663 A | 6/1986 | EerNisse |
| 4,660,420 A | 4/1987 | Eer Nisse |
| 4,724,351 A | 2/1988 | EerNisse et al. |
| 4,754,646 A | 7/1988 | EerNisse et al. |
| 4,802,370 A | 2/1989 | EerNisse et al. |
| 4,814,662 A | 3/1989 | Delaite |
| 4,837,475 A | 6/1989 | EerNisse et al. |
| 4,875,368 A | 10/1989 | Delatorre |
| 4,935,658 A | 6/1990 | EerNisse et al. |
| 4,936,147 A | 6/1990 | EerNisse |
| 4,984,467 A | 1/1991 | Haefner |
| 5,012,151 A | 4/1991 | EerNisse et al. |
| 5,022,130 A | 6/1991 | EerNisse et al. |
| 5,030,876 A | 7/1991 | EerNisse |
| 5,168,191 A | 12/1992 | EerNisse et al. |
| 5,221,873 A | 6/1993 | Totty |
| 5,231,880 A | 8/1993 | Ward |
| 5,299,868 A | 4/1994 | Dennis |
| 5,394,345 A | 2/1995 | Berard et al. |
| 5,471,882 A | 12/1995 | Wiggins |
| 6,111,340 A | 8/2000 | Sinha et al. |
| 6,131,462 A | 10/2000 | EerNisse et al. |
| 6,145,383 A | 11/2000 | Meringdal et al. |
| 6,384,697 B1* | 5/2002 | Ruby ............................ 333/189 |
| 6,455,985 B1 | 9/2002 | Matsumoto |
| 6,461,301 B2 | 10/2002 | Smith |
| 6,598,481 B1 | 7/2003 | Schultz |
| 6,842,088 B2* | 1/2005 | Yamada et al. ................ 333/187 |
| 7,140,084 B2* | 11/2006 | Yamada et al. ............... 29/25.35 |
| 7,334,483 B2 | 2/2008 | Sato |
| 7,482,636 B2* | 1/2009 | Murayama et al. ............. 257/98 |
| 7,812,365 B2* | 10/2010 | Murayama ...................... 257/99 |
| 8,429,976 B2 | 4/2013 | Matsumoto |
| 8,610,336 B1* | 12/2013 | Wang et al. .................... 310/343 |
| 2001/0037066 A1 | 11/2001 | Smith |
| 2003/0230798 A1 | 12/2003 | Lin et al. |
| 2004/0016995 A1 | 1/2004 | Kuo et al. |
| 2004/0129086 A1 | 7/2004 | Binet et al. |
| 2004/0130765 A1* | 7/2004 | Gessner et al. ................ 359/224 |
| 2008/0289431 A1 | 11/2008 | Lohr et al. |
| 2009/0009036 A1 | 1/2009 | Matsumoto et al. |
| 2009/0151461 A1 | 6/2009 | Ishii |
| 2009/0193903 A1 | 8/2009 | Cobianu et al. |
| 2010/0102944 A1 | 4/2010 | Lynn |
| 2010/0242615 A1 | 9/2010 | Sato et al. |
| 2011/0228809 A1* | 9/2011 | Tadigadapa ..................... 374/31 |

FOREIGN PATENT DOCUMENTS

| | | |
|---|---|---|
| EP | 0161533 | 11/1985 |
| EP | 0273649 | 12/1987 |
| EP | 0144311 | 7/1992 |
| EP | 373010 | 6/1994 |
| GB | 2178536 | 2/1987 |
| WO | 8403998 A1 | 10/1984 |

* cited by examiner

THICKNESS SHEAR MODE RESONATOR SENSORS AND METHODS OF FORMING A PLURALITY OF RESONATOR SENSORS

CROSS REFERENCE TO RELATED APPLICATION

This application claims the benefit of U.S. Provisional Patent Application Ser. No. 61/432,433, filed Jan. 13, 2011 entitled "Sensors for Measuring At Least One of Pressure and Temperature, Sensor Arrays and Related Methods," the disclosure of which is incorporated herein by reference in its entirety.

TECHNICAL FIELD

Embodiments of the present disclosure relate to sensors for measurement of at least one of a pressure and temperature and, more particularly, to quartz resonator sensors for measurement of at least one of a pressure and temperature and related methods thereof.

BACKGROUND

Thickness shear mode quartz resonator sensors (also interchangeably called quartz resonator transducers) have been used successfully in the down-hole environment of oil and gas wells for several decades and are still an accurate means of determining bottom-hole pressure and temperature. Quartz resonator pressure and temperature sensors typically have a crystal resonator located inside a housing exposed to ambient bottom-hole fluid pressure and temperature. Electrodes on the resonator element coupled to a high frequency power source drive the resonator and result in shear deformation of the crystal resonator. The electrodes also detect the resonator response to at least one of pressure and temperature and are electrically coupled to conductors extending to associated power and processing electronics isolated from the ambient environment. Ambient pressure and temperature are transmitted to the resonator, via a substantially incompressible fluid within the housing, and changes in the resonator frequency response are sensed and used to determine the pressure and/or temperature and interpret changes in same. For example, a quartz resonator sensor, as disclosed in U.S. Pat. Nos. 3,561, 832 and 3,617,780, includes a cylindrical design with the resonator formed in a unitary fashion in a single piece of quartz. End caps of quartz are attached to close the structure.

Generally, a thickness shear mode quartz resonator sensor assembly may include a first sensor in the form of a primarily pressure sensitive quartz crystal resonator exposed to ambient pressure and temperature, a second sensor in the form of a temperature sensitive quartz crystal resonator exposed only to ambient temperature, a third reference crystal in the form of quartz crystal resonator exposed only to ambient temperature, and supporting electronics. The first sensor changes frequency in response to changes in applied external pressure and temperature with a major response component being related to pressure changes, while the output frequency of the second sensor is used to temperature compensate temperature-induced frequency excursions in the first sensor. The reference crystal, if used, generates a reference signal, which is only slightly temperature-dependent, against or relative to which the pressure- and temperature-induced frequency changes in the first sensor and the temperature-induced frequency changes in the second sensor can be compared. Means for such comparison as known in the art include frequency mixing or using the reference frequency to count the signals for the first and second sensors.

Prior art devices of the type referenced above including one or more thickness shear mode quartz resonator sensors exhibit a high amount of accuracy even when implemented in an environment such as a down-hole environment exhibiting high pressures and temperatures. However, such thickness shear mode quartz resonator sensors may be relatively expensive to fabricate, as each sensor must be individually manufactured. These relatively expensive quartz resonator sensors may not be economically practical for implementation in applications that would benefit from their relatively higher accuracy and ability to operate in a relatively wider range of temperatures and pressures as compared to other less expensive, less accurate and less robust sensors such as strain or piezoresistive gages.

BRIEF SUMMARY

In some embodiments, the present disclosure includes an array of resonator sensors including an active wafer array comprising a plurality of unsingulated active wafers, a first unsingulated end cap array coupled to a first side of the active wafer array, and a second unsingulated end cap array coupled to a second side of the active wafer array. Each unsingulated active wafer comprises a resonating portion wherein the resonating portion of each unsingulated active wafer is out of contact with each of the first and second unsingulated end cap arrays.

In some embodiments, the present disclosure includes a plurality of thickness shear resonator sensors produced by a process including forming a plurality of active wafer locations in a first sheet of material comprising locating a central portion of each active wafer of the plurality of active wafer locations, bounding the plurality of active wafer locations about the central portions thereof to form a first cavity on a first side of each central portion and a second cavity on a second side of each central portion to form an array of resonator sensors, and separating the array of resonator sensors.

In yet additional embodiments, the present disclosure includes a method of forming a plurality of resonator sensors. The method includes forming a plurality of active wafer locations in a unitary structure, coupling a plurality of first end cap structures to a first side of the unitary structure, coupling a plurality of second end cap structures to a second, opposing side of the unitary structure, and separating the plurality of active wafer locations laterally between the end cap structures to form a plurality of discrete resonator sensors.

In yet additional embodiments, the present disclosure includes a method of forming a plurality of resonator sensors. The method includes forming a plurality of active wafer locations in a first sheet of material comprising locating a central portion of each active wafer of the plurality of active wafer locations, bounding the plurality of active wafer locations about the central portions thereof to form a first cavity on a first side of each central portion and a second cavity on a second side of each central portion to form an array of resonator sensors, and separating the array of resonator sensors to form a plurality of discrete resonator sensors.

In yet additional embodiments, the present disclosure includes a thickness shear mode resonator sensor. The thickness shear mode resonator sensor includes an active wafer comprising a resonating element and a first end cap coupled to a first side of the active wafer where at least one surface of the active wafer and at least one surface of the first end cap form a first cavity between the resonating element of the active wafer and the first end cap. The thickness shear mode resonator sensor also includes a second end cap coupled to a second, opposing side of the active wafer where at least one surface of the active wafer and at least one surface of the second end cap form a second cavity between the resonating element of the active wafer and the second end cap. The active wafer exhibits a substantially quadrilateral cross section taken in a direction along an interface of the active wafer and at least one of the first end cap and the second end cap.

BRIEF DESCRIPTION OF THE DRAWINGS

While the specification concludes with claims particularly pointing out and distinctly claiming what are regarded as embodiments of the present disclosure, various features and advantages of embodiments of the disclosure may be more readily ascertained from the following description of example embodiments of the disclosure provided with reference to the accompanying drawings, in which:

DETAILED DESCRIPTION

In the following detailed description, reference is made to the accompanying drawings that depict, by way of illustration, specific embodiments in which the disclosure may be practiced. However, other embodiments may be utilized, and structural, logical, and configurational changes may be made without departing from the scope of the disclosure. The illustrations presented herein are not meant to be actual views of any particular sensor or component thereof, but are merely idealized representations that are employed to describe embodiments of the present disclosure. The drawings presented herein are not necessarily drawn to scale. Additionally, elements common between drawings may retain the same numerical designation.

It is noted that in some of the drawings presented herein, embodiments of resonator sensors and components thereof are shown as being at least partially transparent in order to facilitate description of embodiments of the present disclosure. However, it is understood that materials (e.g., quartz) used to form the resonator sensors and components thereof may be transparent, opaque, variations therebetween, or combinations thereof.

Figure 1:
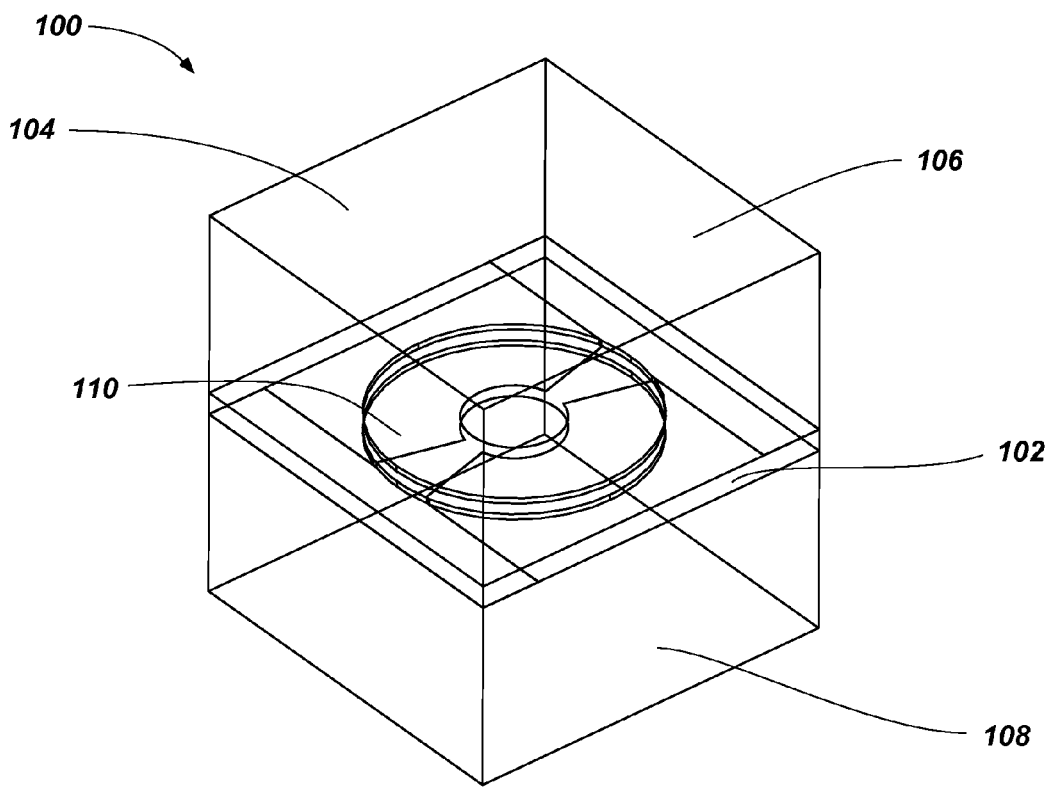
FIG. 1 is a perspective view of resonator sensor in accordance with an embodiment of the present disclosure.

FIG. 1 is a perspective view of a resonator sensor according to the present disclosure. As shown in FIG. 1, the resonator sensor such as, for example, a quartz resonator sensor 100 includes an active wafer 102 at least partially disposed in a housing 104. A portion of the active wafer 102 may be bounded on sides thereof. For example, the housing 102 may include two end caps (e.g., a first end cap 106 end and a second end cap 108) and the active wafer 102 may disposed between the end caps 106, 108 forming the housing 104. An actively vibrating portion of the active wafer 102 (e.g., a resonating portion 114 (FIG. 2)) includes a cavity on both sides enabling the portion of the active wafer 102 to resonate (e.g., displace, vibrate, etc.) when electrically driven at one or more selected frequencies. For example, the active wafer 102 may include a recessed portion 110 forming a central portion of the active wafer 102 (e.g., a resonating portion 114 (FIG. 2)) having a thickness that is less than a thickness of an adjacent portion of the active wafer 102 (e.g., the outer portion 116 (FIG. 2)). In some embodiments, active wafer 102 may include a recessed portion 110 on opposing sides of the active wafer 102 (e.g., opposing faces of the active wafer 102).

In some embodiments, the resonator sensor 100 may have a substantially cuboidal shape. For example, the resonator sensor 100 may exhibit a first substantially quadrilateral (e.g., square) cross-sectional shape and a second substantially quadrilateral cross-sectional shape in a direction substantially transverse to the first cross section. It is noted that, while the embodiment of FIG. 1 illustrates a resonator sensor 100 having a substantially quadrilateral cross-sectional shape, in other embodiments, a resonator sensor may be formed in other geometries (e.g., a circular or disc cross-sectional shape, a polygonal cross-sectional shape, etc.). For example, a resonator sensor may be formed in a substantially cylindrical shape (e.g., the resonator sensor may be somewhat similar to those shown in the above-referenced U.S. Pat. Nos. 3,561, 832 and 3,617,780). In an embodiment, resonator sensors 100 initially formed with a substantially quadrilateral cross-section as described herein may subsequently be formed, for example by grinding on a lathe, into a substantially cylindrical shape. As used herein, the term "substantially cylindrical" does not exclude one or more flats on the exterior of the resonator, and specifically includes shapes having an arcuate outer surface comprising one or more radii, such as ellipsoidal shapes.

Figure 2:
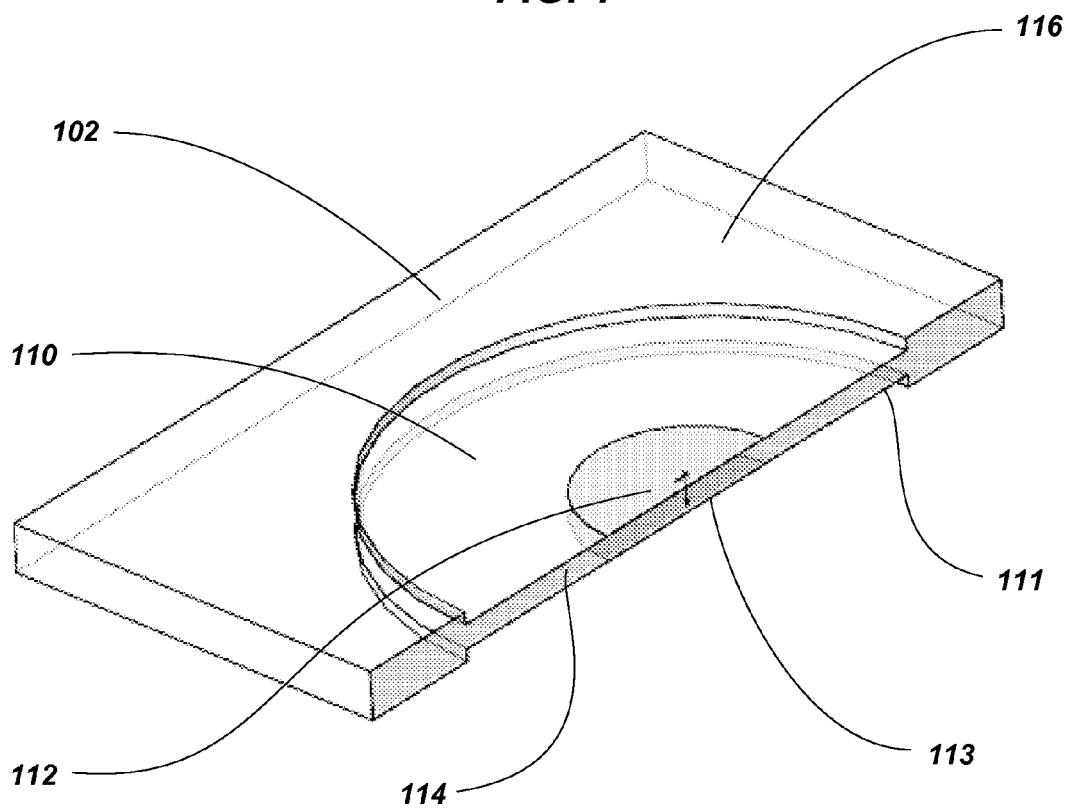
FIG. 2 is a perspective cutaway view of an active wafer of the resonator sensor shown in FIG. 1.

FIG. 2 is an enlarged, perspective cutaway view of the active wafer 102. As shown in FIG. 2, the active wafer 102 may include a first recessed portion 110 formed in a first face of the active wafer 102 and a second recessed portion 111 in a second, opposing face of the active wafer 102. The one or more recessed portions 110, 111 may form a resonating portion 114, which may also be characterized as a resonator element, of the active wafer 102. In other words, the active wafer 102 may comprise an inverted mesa structure having the resonating portion 114 formed by the first and second recessed portions 110, 111 in the center region of the active wafer 102 and a thicker outer portion 116 surrounding the resonating portion 114. In some embodiments, the first recessed portion 110 may be substantially aligned with the second recessed portion 111. For example and as shown in FIG. 2, the recessed portions 110, 111 are substantially aligned with each other (e.g., each point on the outer boundary of the recessed portion 110 is substantially collinear to a similar point of the recessed portion 111).

In some embodiments, portions of the active wafer 102 may be removed to form the recessed portions 110, 111. For example, portions of the active wafer 102 may be removed using an etching process, an abrasive planarization process such as, for example, a chemical-mechanical polishing (CMP) process, or a combination thereof. Etching processes may include, for example, removing portions of the material using a mask (e.g., through photolithography patterning or the like) and a reactive ion (i.e., plasma) etching process or removing the material using a mask and an isotropic wet chemical etching process. It is noted that the particular composition of the gases used to generate the reactive ions, the particular composition of the chemical etchant, and the operating parameters of the etching process may be selected based on the composition of the mask, the material to be etched, and the surrounding materials.

It is noted that the removal techniques discussed above may be utilized to form recesses in other portions of the resonator sensor, for example, one or more of the end cap as discussed below.

The active wafer 102 may include one or more electrodes formed thereon. For example, electrodes 112, 113 may be provided on the opposing recessed portions 110, 111 forming the resonating portion 114 of the active wafer 102. The electrodes 112, 113 may be formed on the active wafer by, for example, deposition techniques (e.g., chemical vapor deposition (CVD), physical vapor deposition (PVD), atomic layer deposition (ALD), sputtering, thermal evaporation, or plating). In some embodiments, the electrodes 112, 113 may be formed from gold with an intermediate layer of chromium between the gold and the quartz active wafer 102 to enhance adhesion. As known in the art, the electrodes 112, 113 are provided to excite vibrational behavior in the resonating portion 114 of the active wafer 102, and are electrically coupled by conductors (not shown in FIG. 2) to a high-frequency driving electronics, as is conventional.

Referring still to FIG. 2, the resonating portion 114 may be a flat resonator (i.e., plano-plano). In other embodiments, a resonating portion 114 or a portion thereof may comprise other shapes such as, for example, plano-convex, etc. In plano-convex resonators, the outer portion 116 surrounding the resonating portion 114 of the active wafer 102 on each side of the active wafer 102 may be substantially flat to enable coupling to the end caps 106, 108.

Figure 3:
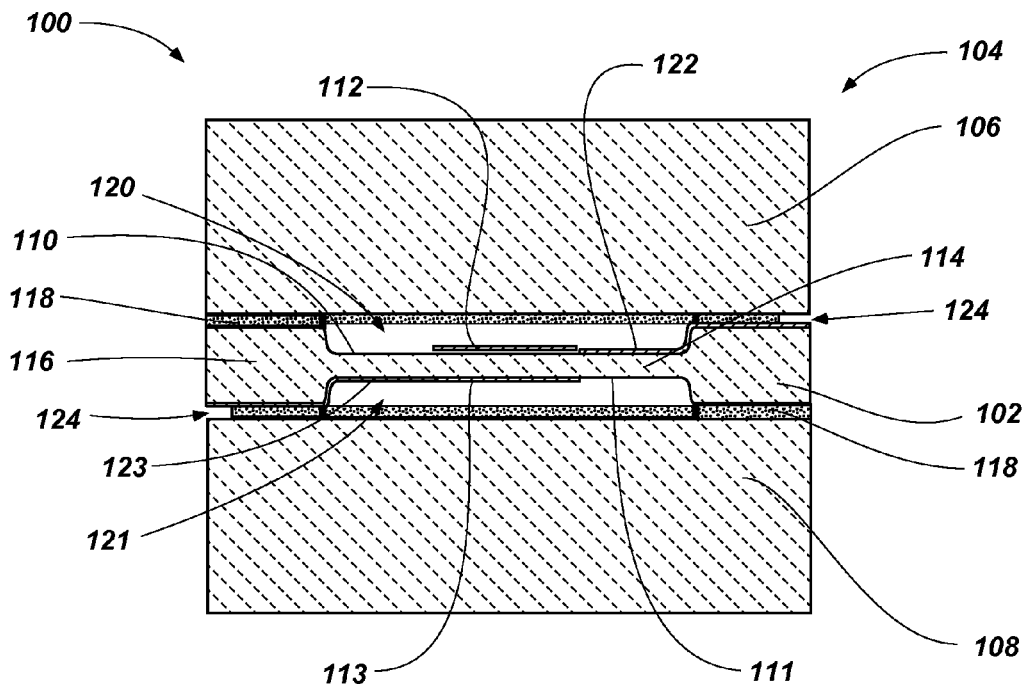
FIG. 3 is a cross-sectional side view of the resonator sensor shown in FIG. 1.

FIG. 3 is a cross-sectional side view of the resonator sensor 100. As shown in FIG. 3, the end caps 106, 108 may be coupled to the active wafer 102 by, for example, an adhesive or bonding process (e.g., a fused glass frit 118). The recessed portions 110, 111 of the active wafer 102 and the end caps 106, 108 form cavities 120, 121 on opposing sides of the resonating portion 114 that enable the resonating portion 114 to vibrate freely. The electrodes 112, 113 may include a portion (e.g., conductive traces 122, 123) extending along the active wafer 102 (e.g., along the resonating portion 114 and the outer portion 116) to an outer portion of the resonator sensor 100 to enable electrical connection between the electrodes 112, 113 and, for example, an electronics assembly. In some embodiments, the fused glass frit 118 formed between one or more end caps 106, 108 and the active wafer 102 proximate to the conductive traces 122, 123 may not extend to an outer surface of the resonator sensor 100. Stated in another way, a recess 124 may be formed in the glass frit 118 proximate the outer portion of a joint formed between one or more end caps 106, 108 and the active wafer 102 such that the conductive traces 122, 123 may be partially exposed at an outer portion of the resonator sensor 100 to enable electrical connection thereto.

Figure 4:
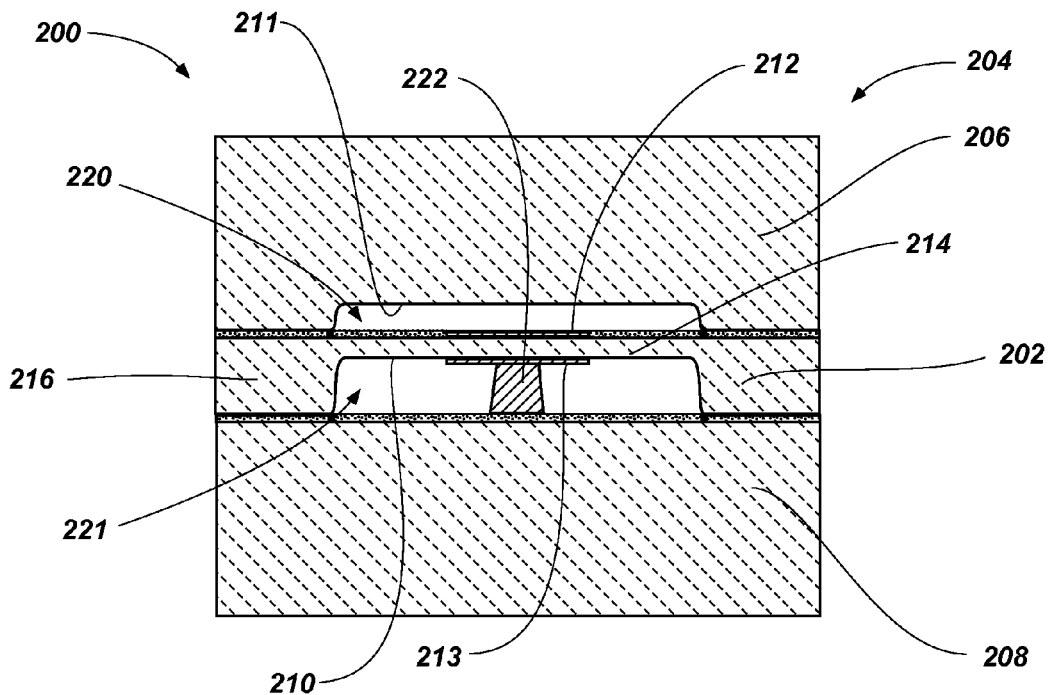
FIG. 4 is a cross-sectional side view of a resonator sensor in accordance with another embodiment of the present disclosure.

FIG. 4 is a cross-sectional side view of a resonator sensor 200 in accordance with another embodiment of the present disclosure. It is noted that the cross-sectional side view of a resonator sensor 200 is taken in direction transverse to the cross-sectional side view of the resonator sensor 100 shown in FIG. 3. As shown in FIG. 4, the resonator sensor 200 may be somewhat similar to the resonator sensor 100 and may include similar elements and methods of forming as shown and described above with reference to FIGS. 1 through 3. For example, the resonator sensor 200 may include an active wafer 202, housing 204, end caps 206, 208, and electrodes 212, 213. The active wafer 202 of the resonator sensor 200 may include a first recessed portion 210 formed in a face of the active wafer 202 such that the active wafer 202 includes a resonating portion 214 and a relatively thicker outer portion 216. A second recessed portion 211 may be formed in a face of the one of the end caps (e.g., end cap 206). The recessed portions 210, 211 may form cavities 220, 221 on opposing sides of the resonating portion 214 of the active wafer 202 to enable the resonating portion 214 to vibrate or otherwise displace under a force applied thereto. One or more of the electrodes 212, 213 may include a conductive trace 222 extending along the active wafer 202 (e.g., along the resonating portion 214 and the outer portion 216).

Figure 5:
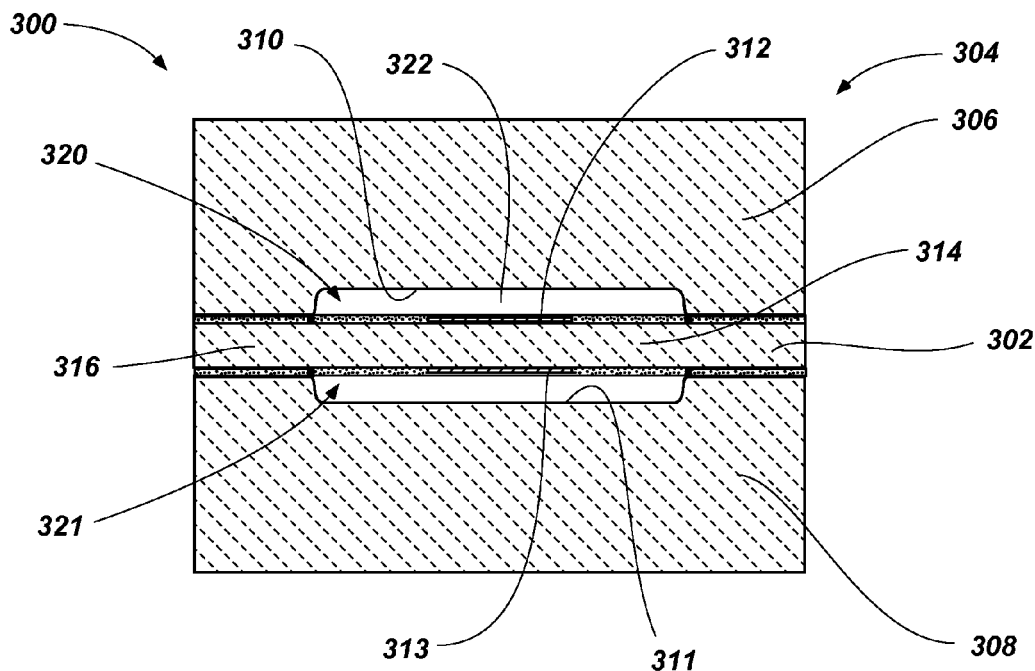
FIG. 5 is a cross-sectional side view of a resonator sensor in accordance with yet another embodiment of the present disclosure.

FIG. 5 is a cross-sectional side view of a resonator sensor 300 in accordance with another embodiment of the present disclosure. Similar to FIG. 4, the cross-sectional side view of a resonator sensor 300 is taken in direction transverse to the cross-sectional side view of the resonator sensor 100 shown in FIG. 3. As shown in FIG. 5, the resonator sensor 300 may be somewhat similar to the resonator sensors 100 and 200 and may include similar elements and methods of forming as shown and described above with reference to FIGS. 1 through 4. For example, the resonator sensor 300 may include an active wafer 302, housing 304, end caps 306, 308, and electrodes 312, 313. A first recessed portion 310 may be formed in a face of the one of the end caps 306. A second recessed portion 311 may be formed in a face of an opposing end cap 308. The active wafer 302 of the resonator sensor 300 may include a resonating portion 314 and an outer portion 316 having substantially the same thickness. The recessed portions 310, 311 formed in the end caps 306, 308 may form cavities 320, 321 on opposing sides of the resonating portion 314 of the active wafer 302 to enable the resonating portion 314 to vibrate or otherwise displace under a force applied thereto. One or more (e.g., both) of the electrodes 312, 313 may include conductive traces 322 extending along the active wafer 302 (e.g., along the resonating portion 314 and the outer portion 316).

Figure 6:
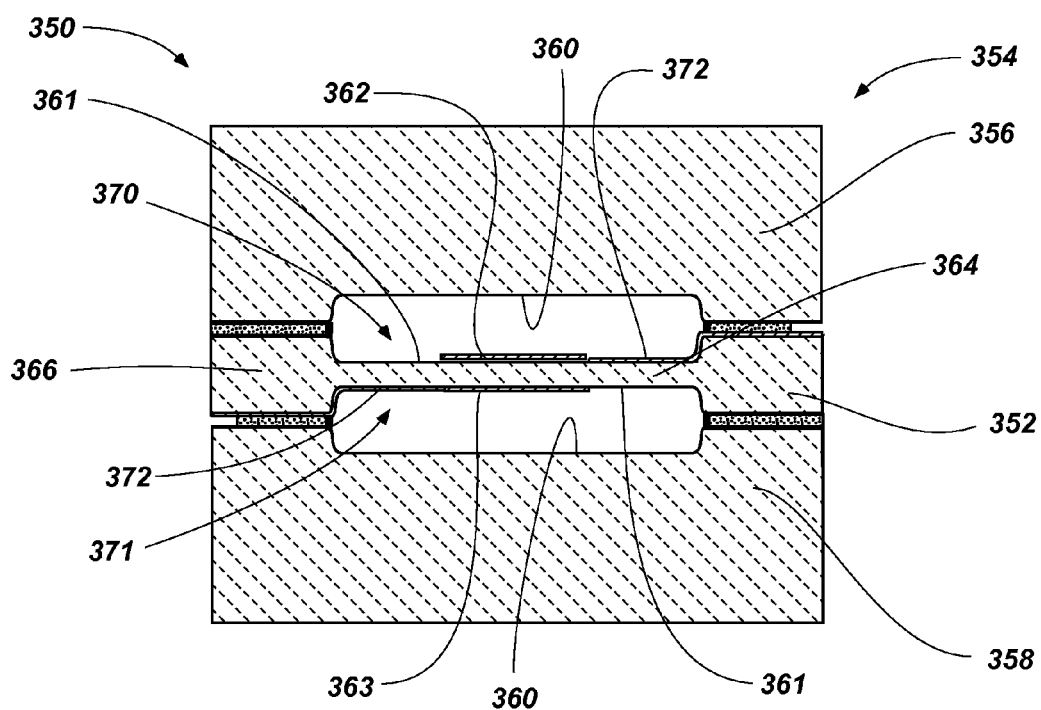
FIG. 6 is a cross-sectional side view of a resonator sensor in accordance with yet another embodiment of the present disclosure.

FIG. 6 is a cross-sectional side view of a resonator sensor 350 in accordance with yet another embodiment of the present disclosure. The cross-sectional side view of a resonator sensor 350 is taken in direction similar to that of the cross-sectional side view of the resonator sensor 100 shown in FIG. 3. As shown in FIG. 6, the resonator sensor 350 may be somewhat similar to the resonator sensors 100, 200, and 300 and may include similar elements and methods of forming as shown and described above with reference to FIGS. 1 through 5. For example, the resonator sensor 350 may include an active wafer 352, housing 354, end caps 356, 358, and electrodes 362, 363. First recessed portions 360 may be formed in a face of both of the end caps 356. Second recessed portions 361 may be formed in two, opposing faces of the active wafer 352 such that the active wafer 352 includes a resonating portion 364 and a relatively thicker outer portion 366. The recessed portions 360 formed in the end caps 356, 358 and the recessed portions 361 formed in active wafer 352 may form cavities 370, 371 on opposing sides of the resonating portion 364 of the active wafer 352 to enable the resonating portion 364 to vibrate or otherwise displace under a force applied thereto. One or more (e.g., both) of the electrodes 362, 363 may include conductive traces 372 extending along the active wafer 352 (e.g., along the resonating portion 364 and the outer portion 366).

In some embodiments, the components of resonator sensors 100, 200, 300, and 350 may be fabricated from single crystal quartz, for example, from quartz plates cut to exhibit an AT-cut, BT-cut, or other suitable orientation. In some embodiments, the resonator sensors 100, 200, 300, and 350 may include methods of fabrication, orientations, electronic assemblies, housings, reference sensors, and components similar to the sensors and transducers disclosed in, for example, U.S. Pat. No. 5,471,882 to Wiggins, U.S. Pat. No. 4,550,610 to EerNisse et al., and U.S. Pat. No. 3,561,832 to Karrer et al., the disclosure of each of which is hereby incorporated herein in its entirety by this reference. For example, dimensional characteristics of components of resonator sensors 100, 200, 300, and 350 (e.g., dimensions of the end caps, active wafer, cavities, recesses, etc.) may be varied to adjust the pressure and/or temperature sensitivity thereof, by adjusting the stress experienced by the center portion of resonating portion responsive to application of external pressure to the resonator sensors. In some embodiments, the resonator sensors 100, 200, 300, or 350 may be implemented in a transducer including drive and signal processing electronics similar to those described in, for example, U.S. Pat. No. 5,231,880 to Ward et al., the disclosure of which is hereby incorporated herein in its entirety by this reference, or any other suitable arrangement.

Figure 7:
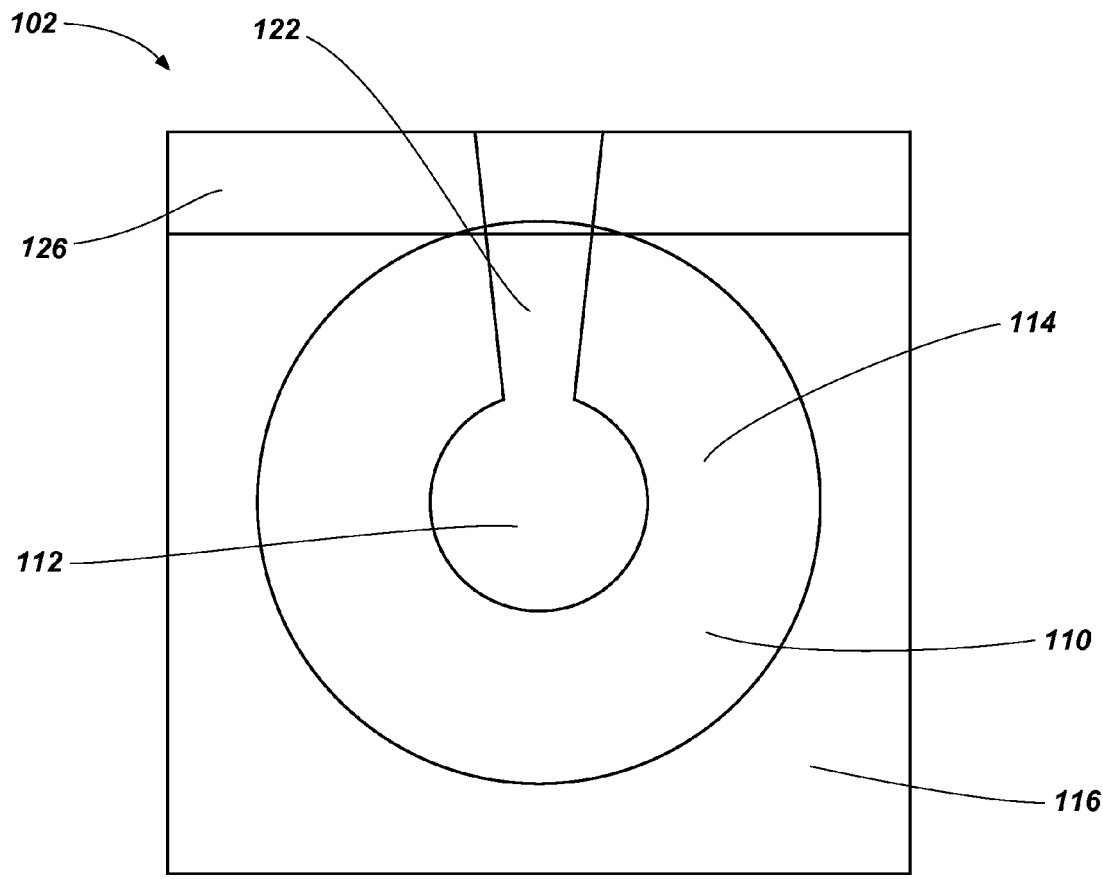
FIG. 7 is a top view of an active wafer of a resonator sensor in accordance with yet another embodiment of the present disclosure.

FIG. 7 is a top view of an active wafer such as, for example, active wafer 102. As shown in FIG. 7, the active wafer 102 may include a recessed portion 110 formed therein, a resonating portion 114, an outer portion 116, and electrode 112 formed on the resonating portion 114. The electrode 112 may include a conductive trace 122 extending from the resonating portion 114 to an edge of the active wafer 102. In some embodiments, a tab 126 may be formed proximate an edge of the active wafer 102 (e.g., formed along an edge of the active wafer 102). The tab 126 may be electrically connected to the electrode 112 via the conductive trace 122 to enable an electronics assembly to be connected to the electrode 112 via the tab 126 proximate the edge of the active wafer 102. In some embodiments, the tab 126 may be disposed on the active wafer 102 (e.g., over or under the conductive trace 122) by, for example, the deposition techniques described above. In some embodiments, a tab 126 may be formed from gold with an intermediate layer of chromium between the gold and the quartz active wafer 102 to enhance adhesion. In some embodiments, a portion of the tab 126 may overlap the recessed portion 110 of the active wafer 102. It is noted that while the embodiment of FIG. 7 illustrates one side (e.g., a first side) of the active wafer 102, another side may be substantially similar to the side shown in FIG. 7. For example, a second, opposing side of the active wafer 102 may be similar to the first side shown in FIG. 7; however, the second side may be a substantially mirror image of the first side (e.g., as shown in FIG. 3).

In some embodiments, the active wafer 102 may be substantially square, having a length of approximately 0.240 inch (approximately 6.096 millimeters) on each side. The active wafer 102 may have a thickness of approximately 0.004 inch (approximately 0.1016 millimeter).

In some embodiments, the resonating portion 114 (i.e., the recessed portion 110) and the electrode 112 may be formed to have a substantially circular shape. For example, the resonating portion 114 may have a diameter of between approximately 0.110 inch and 0.150 inch (approximately between 2.794 millimeters and 3.81 millimeters) and the electrode 112 may have a diameter of between approximately 0.050 inch and 0.090 inch (approximately between 1.27 millimeters and 2.286 millimeters).

In some embodiments and as discussed above with reference to FIG. 3, a recess 124 may be formed in the adhesive or bonding layer (e.g., the glass frit 118) adjacent a periphery of the sensor assembly. The recess 124 may expose a portion of the tab 126 for forming electrical connection between the electrode 112 and an electronics assembly via the tab 126.

Figure 8:
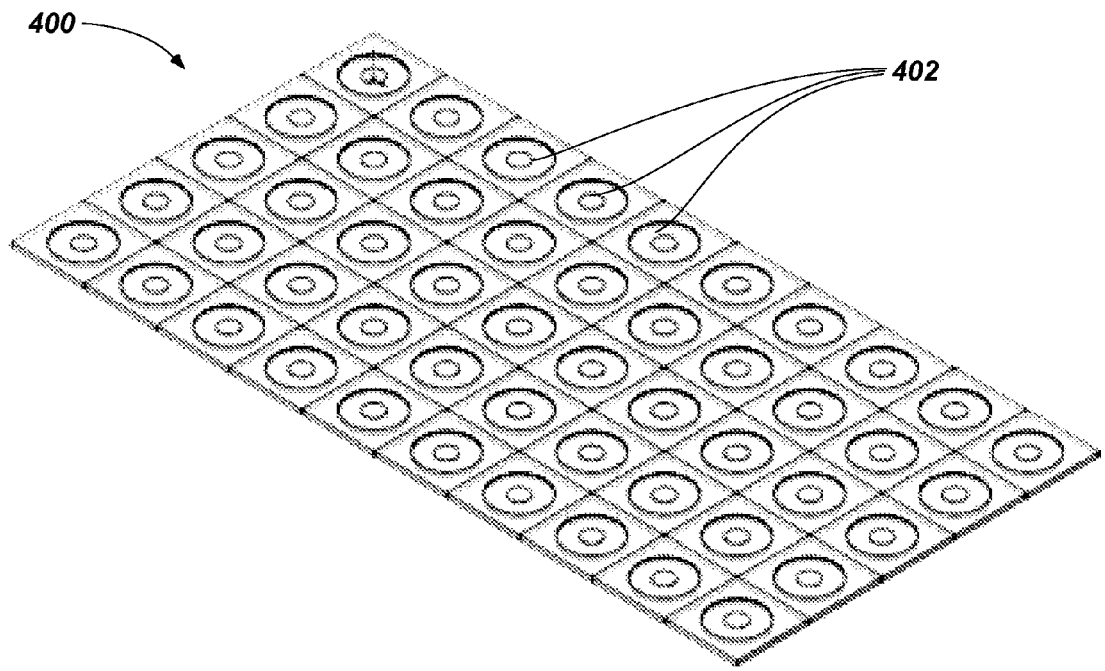
FIG. 8 is a top view of an array of active wafers for use in resonator sensors in accordance with yet another embodiment of the present disclosure.
Figure 9:
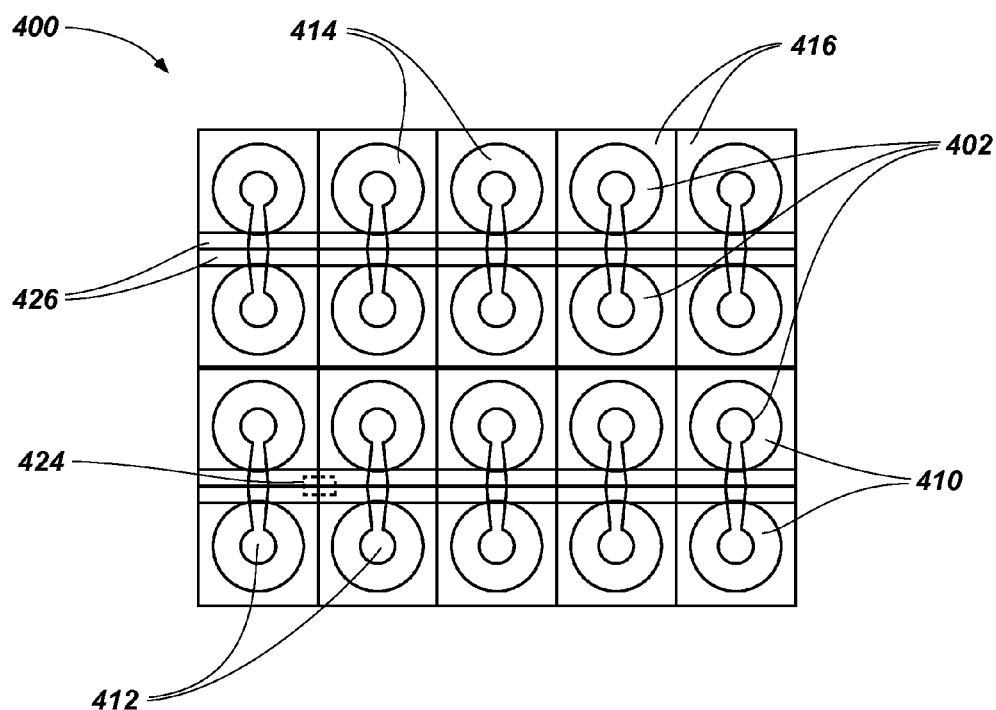
FIG. 9 is a top view of a portion of the array of active wafers shown in FIG. 8.

FIG. 8 is a top view of an array of unsingulated active wafers for use in resonator sensors in accordance with yet another embodiment of the present disclosure. As shown in FIG. 8, an array 400 including a plurality of active wafers 402 may be formed as a unitary structure (e.g., a plate or sheet of cultured quartz having a thickness of, for example, approximately 0.004 inch (approximately 0.1016 millimeter)). In some embodiments, the plurality of active wafers 402 of the array 400 may include the elements, features, and methods of forming of the active wafers 102, 202, 302 described above with reference to FIGS. 1 through 7. For example, as shown in FIG. 9, the plurality of active wafers 402 of the array 400 may include recessed portions 410 formed therein, resonating portions 414, outer portions 416, electrodes 412, and tabs 426. In some embodiments, as represented by a portion of array 400 shown in dashed lines, a recess 424 may be formed (e.g., in the adhesion layer, in the array, in the end caps, etc.) to expose portions of the tabs 426 for electrical connection thereto. For example, during adhesion or bonding of the array 400 to one or more ends caps (e.g., end caps 106, 108 (FIG. 1)), the recess 424 may be formed at a corner portion of two or more active wafers 402 such that one recess 424 of the array 400 may provide two to four individual recesses in the separate active wafers 402.

Figure 10:
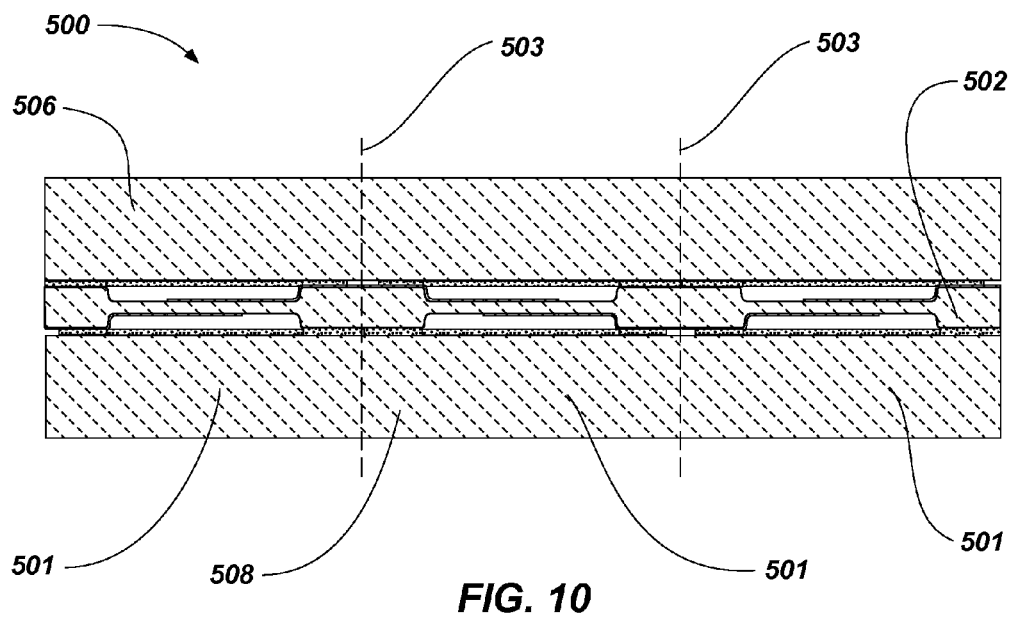
FIG. 10 is a cross-sectional side view of an array of resonator sensors in accordance with yet another embodiment of the present disclosure.

FIG. 10 is a cross-sectional side view of an array of resonator sensors in accordance with yet another embodiment of the present disclosure. As shown in FIG. 10, an array 500 including a plurality of quartz resonator sensors 501 may be formed as a unitary structure. For example, the array 500 including the plurality of quartz resonator sensors 501 may be formed from an array of active wafers 502 (e.g., array 400 of active wafers 402 as shown and described with reference to FIGS. 8 and 9). The array 500 including the plurality of quartz resonator sensors 501 may include one or more arrays of end caps 506, 508, each array being formed as a unitary structure (e.g., one or more plates of cultured quartz a thickness of, for example, approximately 0.070 inch (approximately 1.778 millimeters)). In some embodiments, the ratio of the thickness of at least one of the end caps 506, 508 to the thickness of the active wafers 502 may be 10:1 or greater (e.g., 15:1, 17.5:1, 20:1, etc.).

Figure 11:
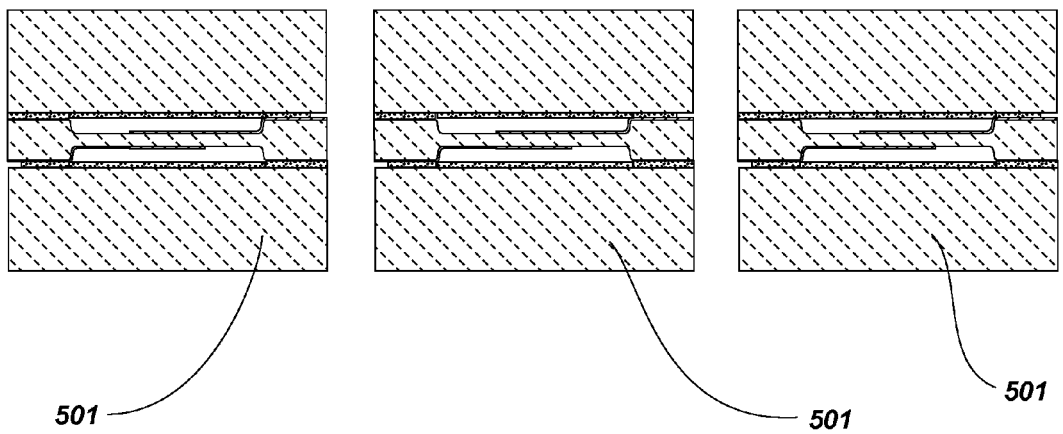
FIG. 11 is a cross-sectional side view of the array of resonator sensors shown in FIG. 10 that have been separated to form individual resonator sensors.

As shown in FIG. 10, the array 500 including the plurality of quartz resonator sensors 501 may be separated (e.g., singulated) to form individual resonator sensors 501 (FIG. 11). For example, the array 500 including the plurality of quartz resonator sensors 501 may be separated along dashed lines 503 (e.g., separated along a plane transverse to interfaces between the array 400 of active wafers 402 and the arrays of end caps 506, 508). The array 500 including the plurality of quartz resonator sensors 501 may be separated through a processes such as, for example, a dicing process (e.g., a diamond-edged dicing saw), a scribing and breaking process, laser cutting, or any other suitable singulation or cutting process.

FIG. 11 is a cross-sectional side view of the array 500 of resonator sensors 501 that have been separated to form individual resonator sensors 501. The resonator sensors 501 may include any of the elements, features, and methods of forming discussed above with reference to FIGS. 1 through 9.

Embodiments of the current disclosure may be particularly useful in forming and providing resonator sensors (e.g., quartz resonator sensors) having a relatively simplified design such as a resonator sensor having an active wafer including an inverted mesa design. Such resonator sensors may enable the production thereof in quantities greater than one. In other words, multiple sensors may be fabricated simultaneously out of sheets or plates of quartz and may be subsequently separated to form individual resonator sensors.

While the disclosure may be susceptible to various modifications and alternative forms, specific embodiments have been shown by way of example in the drawings and have been described in detail herein. However, it should be understood that the disclosure is not intended to be limited to the particular forms disclosed. Rather, the disclosure encompasses all modifications, variations, combinations, and alternatives falling within the scope of the disclosure as defined by the following appended claims and their legal equivalents.

What is claimed is:

1. A plurality of thickness shear mode resonator sensors produced by a process, comprising:
    forming a plurality of active wafer locations in a first sheet of material comprising:
        locating a central portion of each active wafer of the plurality of active wafer locations; and
        bounding the plurality of active wafer locations about the central portions thereof to form a first cavity on a first side of each central portion and a second cavity on a second side of each central portion to form an array of resonator sensors; and
    separating the array of resonator sensors.

2. The plurality of thickness shear mode resonator sensors of claim 1, wherein forming a plurality of active wafer locations in a first sheet of material further comprises forming the central portion in each active wafer location of the plurality of active wafer locations to have a thickness less than a thickness of an outer portion of the active wafer location.

3. The plurality of thickness shear mode resonator sensors of claim 1, wherein bounding the plurality of active wafer locations about the central portions thereof and over the first and second cavities on the first side and on the second side comprises:
    coupling a first side of the first sheet of material to a second sheet of material comprising a plurality of first end caps to cover the first side of the plurality of active wafer locations; and
    coupling a second side of the first sheet of material to a third sheet of material comprising a plurality of second end caps to cover the second side of the plurality of active wafer locations.

4. The plurality of thickness shear mode resonator sensors of claim 3, wherein coupling a first side of the first sheet of material to a second sheet of material and coupling a second side of the first sheet of material to a third sheet of material comprises coupling with a fused glass frit.

5. The plurality of thickness shear mode resonator sensors of claim 1, further comprising forming the plurality of resonator sensors to each exhibit a substantially quadrilateral cross section.

6. The plurality of thickness shear mode resonator sensors of claim 1, further comprising forming the plurality of resonator sensors to each exhibit a substantially cylindrical cross section.

7. A method of forming a plurality of resonator sensors, comprising:
    forming a plurality of active wafer locations in a unitary structure;
    coupling a plurality of first end cap structures to a first side of the unitary structure;
    coupling a plurality of second end cap structures to a second, opposing side of the unitary structure; and
    separating the plurality of active wafer locations laterally between the end cap structures to form a plurality of discrete resonator sensors.

8. A method of forming a plurality of resonator sensors, comprising:
    forming a plurality of active wafer locations in a first sheet of material comprising:
        locating a central portion of each active wafer of the plurality of active wafer locations;
        bounding the plurality of active wafer locations about the central portions thereof to form a first cavity on a first side of each central portion and a second cavity on a second side of each central portion to form an array of resonator sensors; and
    separating the array of resonator sensors to form a plurality of discrete resonator sensors.

9. The method of claim 8, wherein forming a plurality of active wafer locations in a first sheet of material further comprises forming the central portion in each active wafer location of the plurality of active wafer locations to have a thickness less than a thickness of an outer portion of the active wafer location.

10. The method of claim 8, wherein bounding the plurality of active wafer locations about the central portions thereof and over the first and second cavities on the first side and on the second side comprises:
    coupling a first side of the first sheet of material to a second sheet of material comprising a plurality of first end caps to cover the first side of the plurality of active wafer locations; and
    coupling a second side of the first sheet of material to a third sheet of material comprising a plurality of second end caps to cover the second side of the plurality of active wafer locations and to form an array of resonator sensors.

11. The method of claim 8, wherein separating the array of resonator sensors comprises separating the array of resonator sensors along a plane transverse to an interface between the first sheet of material and at least one of the second sheet of material and the third sheet material.

12. The method of claim 8, wherein forming a plurality of active wafer locations in a first sheet of material further comprises:
    forming a first electrode on the central portion of each active wafer location of the plurality of active wafer locations on the first side of the first sheet of material;
    extending the first electrode to a conductive tab formed on an outer portion of each active wafer location of the plurality of active wafer locations on the first side of the first sheet of material;

forming a second electrode on the central portion of each active wafer location of the plurality of active wafer locations on the second side of the first sheet of material; and extending the second electrode to a conductive tab formed on an outer portion of each active wafer location of the plurality of active wafer locations on the second side of the first sheet of material.

13. The method of claim 12, further comprising:

providing at least one recess in an interface between the first sheet of material and the second sheet of material to expose a conductive tab formed on at least one active wafer location of the plurality of active wafer locations; and providing at least one recess in an interface between the first sheet of material and the third sheet of material to expose another conductive tab formed on at least one active wafer location of the plurality of active wafer locations.

14. The method of claim 8, wherein forming a plurality of active wafer locations in a first sheet of material further comprises forming the plurality of active wafer locations in a quartz plate.

* * * * *